(12) United States Patent  
Chou

(10) Patent No.: US 10,806,050 B1  
(45) Date of Patent: Oct. 13, 2020

(54) SOLID-STATE DRIVE ADAPTER CARD

(71) Applicant: Yao-Fang Chou, New Taipei (TW)

(72) Inventor: Yao-Fang Chou, New Taipei (TW)

( * ) Notice: Subject to any disclaimer, the term of this patent is extended or adjusted under 35 U.S.C. 154(b) by 0 days.

(21) Appl. No.: 16/580,896

(22) Filed: Sep. 24, 2019

(51) Int. Cl.
- *H05K 1/02* (2006.01)
- *H05K 7/20* (2006.01)
- *G06F 1/18* (2006.01)
- *G06F 3/06* (2006.01)

(52) U.S. Cl.
CPC ......... *H05K 7/20172* (2013.01); *G06F 1/187* (2013.01); *G06F 3/0688* (2013.01); *H05K 7/20154* (2013.01)

(58) Field of Classification Search
CPC . G06F 1/20; G06F 1/187; G06F 1/185; G06F 1/206; H05K 7/2039; H05K 1/0203; H05K 7/20509; H05K 2201/066; H05K 1/0201; H05K 5/0021; F28D 2021/0029; F28F 2215/04; F28F 1/30
USPC .. 361/679.47, 715, 704, 679.32, 679.4, 689, 361/719, 702, 720, 690; 165/80.3, 104.33
See application file for complete search history.

(56) References Cited

U.S. PATENT DOCUMENTS

| | | | |
|---|---|---|---|
| 10,055,379 B2* | 8/2018 | Shin | G06F 3/067 |
| 10,264,694 B1* | 4/2019 | Lin | H01R 12/7076 |
| 2016/0335220 A1* | 11/2016 | Breakstone | G06F 13/4282 |

* cited by examiner

Primary Examiner — Mandeep S Buttar  
(74) *Attorney, Agent, or Firm* — WPAT, PC

(57) ABSTRACT

A solid-state drive (SSD) adapter card is provided, which includes a card body provided with a low connection base and a high connector base. A first M.2 SSD and a second M.2 SSD are inserted into the low connection base and the high connection base respectively. There is a heat dissipation bottom plate between the first M.2 SSD and the second M.2 SSD. One end, protruding from the second M.2 SSD, of the heat dissipation bottom plate is provided with a heat sink, and a fan is disposed thereon. A heat dissipation cover is disposed on the outer side of the second M.2 SSD and fixed on the heat dissipation bottom plate; the heat dissipation cover is also provided with a heat sink. Via this structure, the card body can be installed with several SSDs, which can increase the capacity of the adapter card and improve the operational stability.

7 Claims, 6 Drawing Sheets

US 10,806,050 B1

SOLID-STATE DRIVE ADAPTER CARD

BACKGROUND OF THE INVENTION

1. Field of the Invention

The present invention relates to a solid-state drive adapter card, in particular to a solid-state drive adapter card capable of being installed with several M.2 solid-state drives.

2. Description of the Prior Art

M.2 solid-state drives (SSD) have many advantages; for example, M.2 SSDs are small and of high speed. Besides, the prices of M.2 SSDs are also gradually decreasing, so M.2 SSDs are gradually become many people's first choice when they purchase or upgrade computers.

However, most computer motherboards only provide a few connection bases for M.2 interface because of space limit, which significantly limits their capacities for M.2 SSDs. Therefore, the performance of the computers cannot be effectively improved.

So as to solve the above problem, various SSD adapter cards are developed in the form of interface card. A SSD adapter card includes interface card slots capable of being installed with M.2 SSDs, which can obviously increase the capacity and satisfy the requirements of users.

Nevertheless, a currently available SSD adapter card can be installed with only a few M.2 SSDs due to heat dissipation. For instance, a low-profile SSD adapter card can be installed with only 2 M.2 SSDs and a full-height SSD adapter card can be installed with only 4 M.2 SSDs, or the heat cannot be effectively dissipated. If the heat cannot be effectively dissipated, these M.2 SSDs cannot work normally and may even malfunction.

Therefore, it has become an important issue to develop a SSD adapter card capable of enhancing heat dissipation in a limited space so as to solve the above problems.

SUMMARY OF THE INVENTION

Therefore, it is a primary objective of the present invention to provide a solid-state drive (SSD) adapter card with improved heat dissipation to increase the capacity thereof for more M.2 SSDs so as to satisfy the requirements of storing a large amount of data.

It is another objective of the present invention to provide a SSD adapter card with smooth appearance and stable structure so as to make the SSD adapter card be able to stably work in a computer for a long time.

To achieve the foregoing objectives, the present invention provides a SSD adapter card, which includes a card body, a low connection base, a high connection base, a heat dissipation bottom plate and a heat dissipation cover.

The card body includes a terminal disposed on the bottom thereof and connected to an interface card slot. The low connection base is disposed on the card body and includes a first slot for a first M.2 solid-state drive to be inserted therein. The high connection base is disposed on the card body and the first slot faces away from the high connection base. The high connection base includes a second slot, taller than the low connection base, for a second M.2 solid-state drive to be inserted therein. The heat dissipation bottom plate is disposed between the first M.2 solid-state drive and the second M.2 solid-state drive, and fixed on the card body. One end, protruding from the second M.2 solid-state drive, of the heat dissipation bottom plate is provided with a first heat sink, and a fan is disposed thereon. The heat dissipation cover is disposed on the outer side of the second M.2 solid-state drive and fixed on the heat dissipation bottom plate. The heat dissipation cover is provided with a second heat sink.

Via the above structure, the card body can be installed with several SSDs, which can increase the capacity of the adapter card and improve the operational stability.

Preferably, the first heat sink of the heat dissipation bottom plate and the second heat sink of the heat dissipation cover are arranged in the same direction. Therefore, when the heat dissipation cover is fixed on the heat dissipation bottom plate, the first heat sink is completely connected to the second heat sink so as to improve heat dissipation.

Preferably, the height of the second heat sink of the heat dissipation cover is less than the height of the first heat sink of the heat dissipation bottom plate. Thus, when the heat dissipation cover is fixed on the heat dissipation bottom plate, the top surface of the first heat sink is aligned with the top surface of the second heat sink.

Preferably, the fan directly faces heating elements (e.g. a chip or a circuit) on the card body.

Preferably, the first heat sink of the heat dissipation bottom plate includes a recess and the fan is disposed inside the recess.

Preferably, the both sides of the card body are provided with the low connection base, the high connection base, the heat dissipation bottom plate, the heat dissipation cover, the first M.2 solid-state drive and the second M.2 solid-state drive respectively. Besides, at least one screw rod penetrates through the both sides of the card body in order to fix the heat dissipation bottom plates and the heat dissipation covers.

BRIEF DESCRIPTION OF THE DRAWINGS

For a better understanding of the aforementioned embodiments of the invention as well as additional embodiments thereof, reference should be made to the Description of Embodiments below, in conjunction with the following drawings in which like reference numerals refer to corresponding parts throughout the figures.

DETAILED DESCRIPTION OF THE PREFERRED EMBODIMENT

Figure 1:
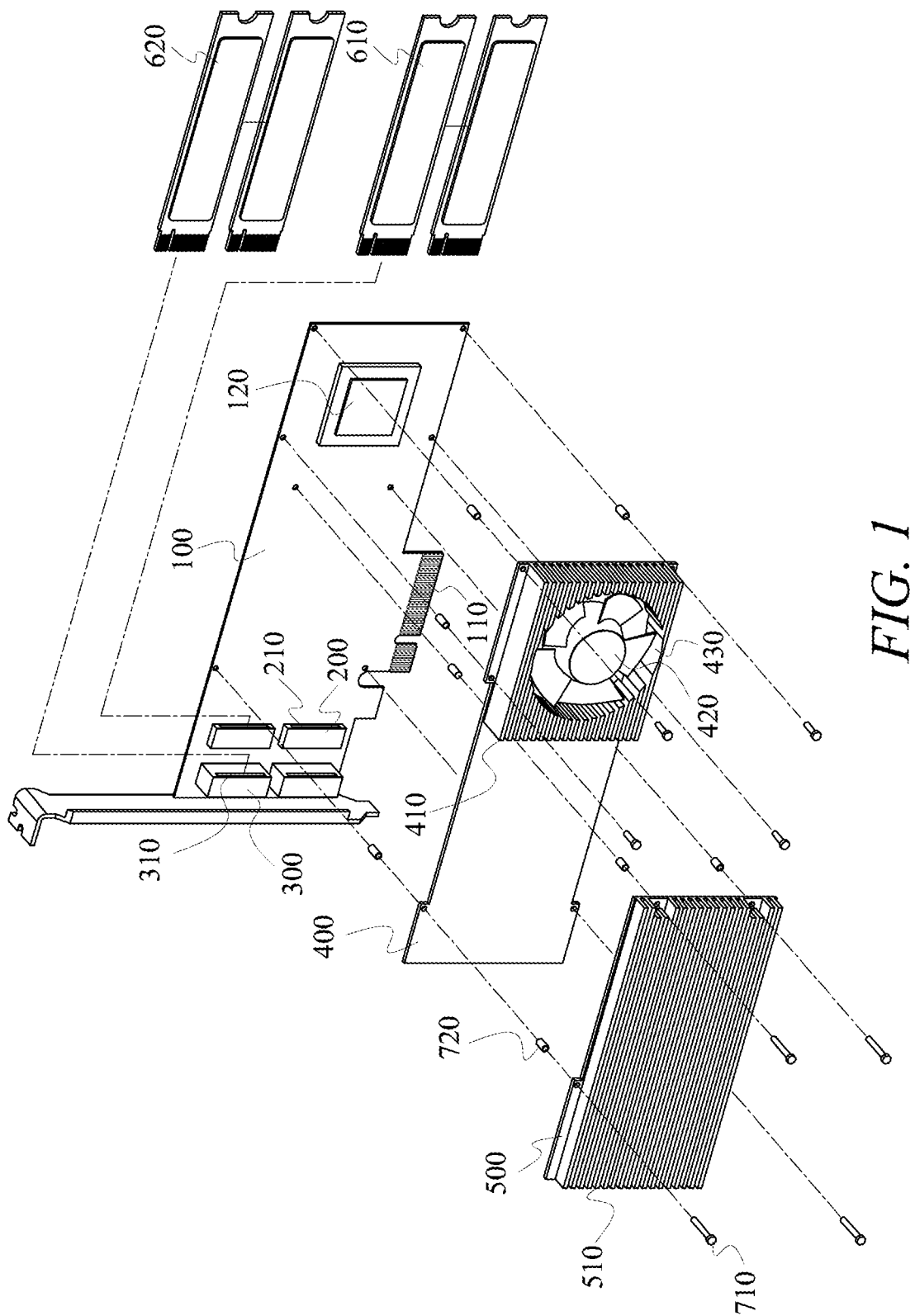
FIG. 1 is the exploded view of the solid-state drive (SSD) adapter card of the first embodiment in accordance with the present invention.
Figure 2:
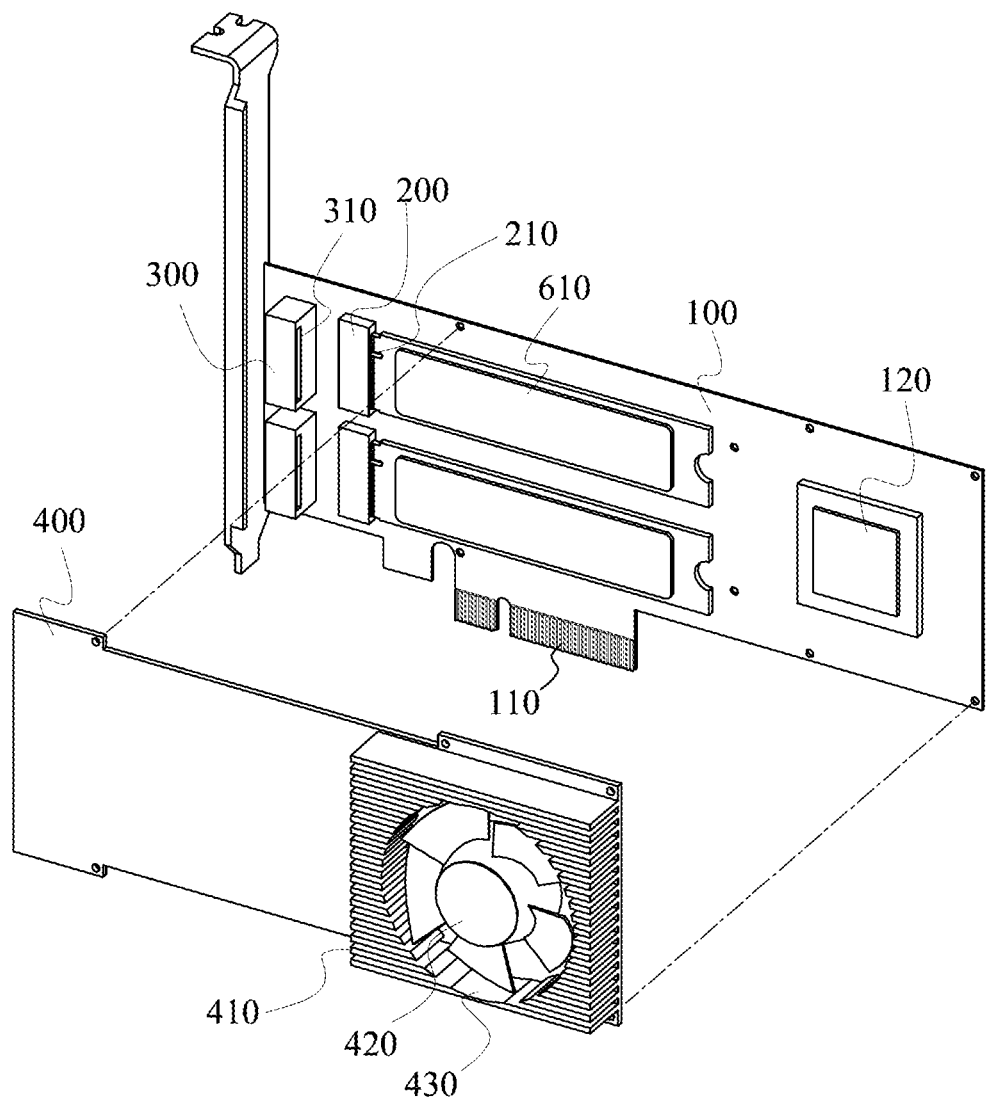
FIG. 2 is the schematic view of the arrangement of the low connection base, the first M.2 SSD and the heat dissipation bottom plate of the first embodiment in accordance with the present invention.
Figure 3:
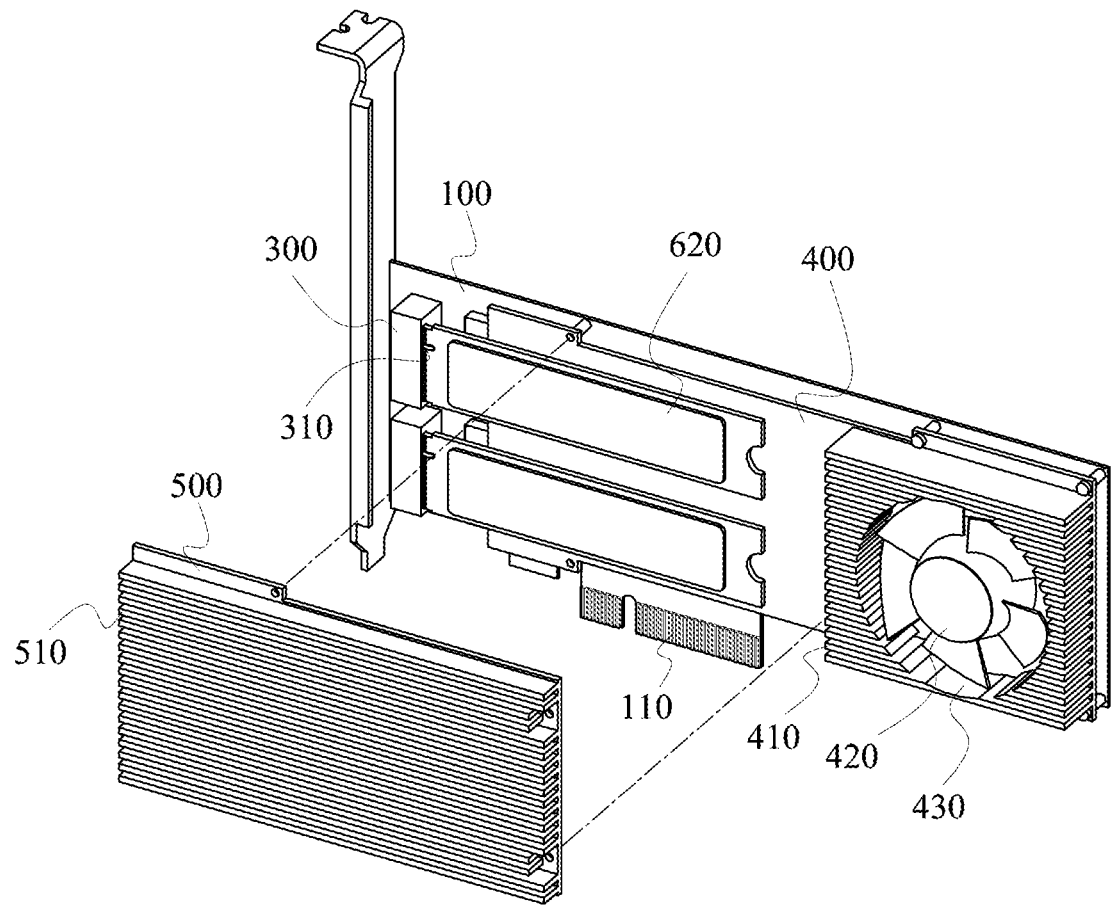
FIG. 3 is the schematic view of the arrangement of the high connection base, the second M.2 SSD and the heat dissipation cover of the first embodiment in accordance with the present invention.
Figure 4:
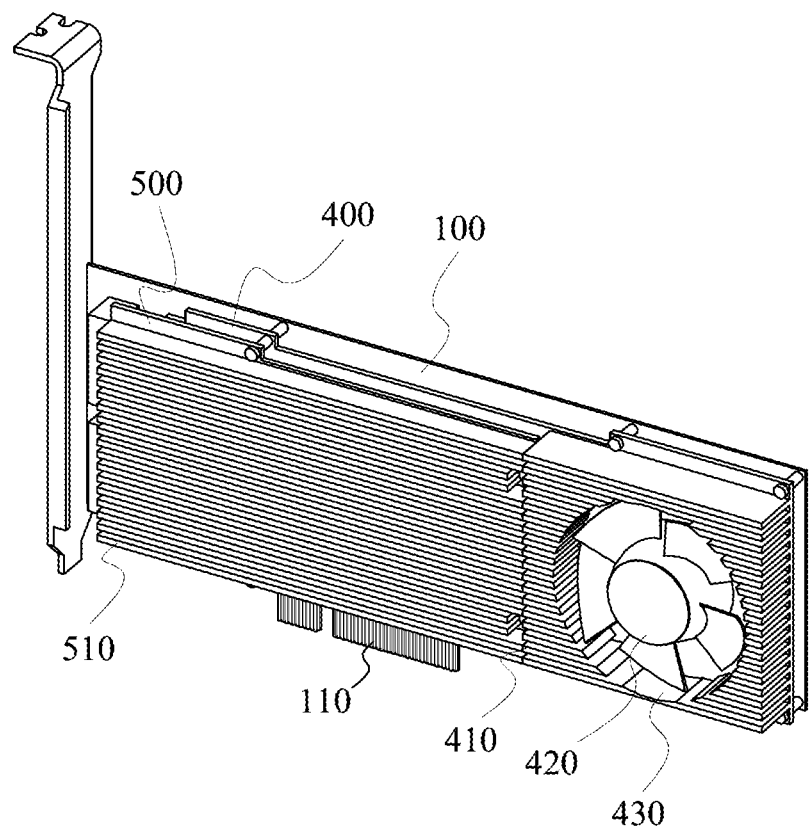
FIG. 4 is the assembly view of the SSD adapter card of the first embodiment in accordance with the present invention.

The following description is about embodiments of the present invention; however it is not intended to limit the scope of the present invention.

With reference to FIG. 1~FIG. 4 for the solid-state drive (SSD) adapter card of the first embodiment in accordance with the present invention, the SSD adapter card includes a card body 100, a low connection base 200, a high connection base 300, a heat dissipation bottom plate 400 and a heat dissipation cover 500.

The card body 100 provided an installation space and includes a terminal 110, disposed on the bottom thereof, connected to an interface card slot.

The low connection base 200 is disposed on the card body 100 and includes a first slot 210 for a first M.2 solid-state drive 610 to be inserted therein.

The high connection base 300 is disposed on the card body 100 and the first slot 210 faces away from the high connection base 300. The high connection base 300 includes a second slot 310, taller than the low connection base 200, for a second M.2 solid-state drive 620 to be inserted therein.

The heat dissipation bottom plate 400 is disposed between the first M.2 solid-state drive 610 and the second M.2 solid-state drive 620, and fixed on the card body 100. One end, protruding from the second M.2 solid-state drive 620, of the heat dissipation bottom plate 400 is provided with a first heat sink 410, and a fan 420 is disposed on the first heat sink 410.

The heat dissipation cover 500 is disposed on the outer side of the second M.2 solid-state drive 620 and fixed on the heat dissipation bottom plate 400. The heat dissipation cover 500 is provided with a second heat sink 510.

Via the above structure, the heat of the first M.2 solid-state drive 610 and the second M.2 solid-state drive can be dissipated via the first heat sink 410 of the heat dissipation bottom plate 400 and the second heat sink 510 of the heat dissipation cover 500, so the SSD adapter card can stably operate. In this way, the SSD adapter card can be installed with more M.2 SSDs in order to provide more capacity.

Figure 5:
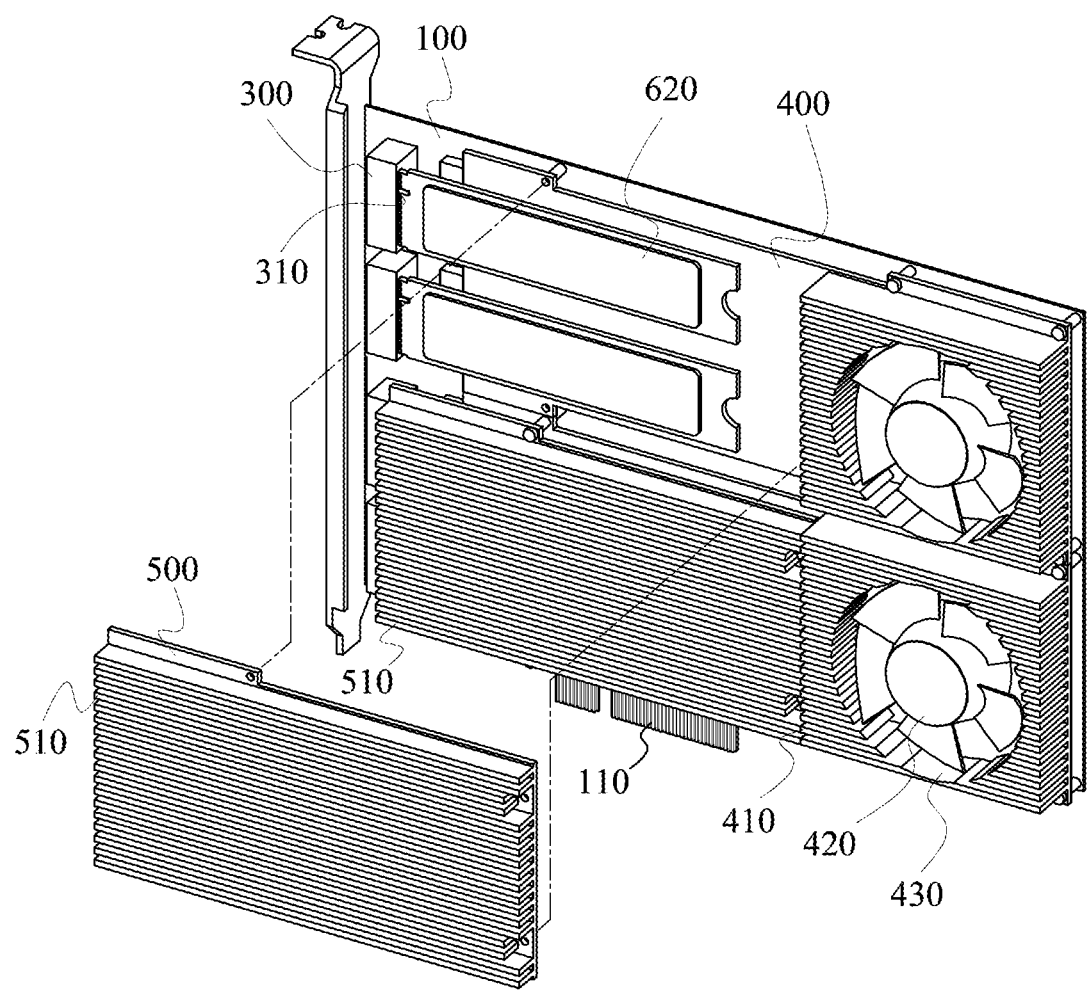
FIG. 5 is the schematic view of the full-height SSD adapter card installed with plural SSDs of the second embodiment in accordance with the present invention.

In the embodiment, the card body 100 is designed for a low-profile adapter card, which can be installed with at least 4 M.2 SSDs. In another embodiment, as shown in FIG. 5, the card body 100 is designed for a full-height adapter card, which can be installed with 8 or more 8 M.2 SSDs (FIG. 5 only shows 4 second M.2 SSDs).

The card body 100, the heat dissipation bottom plate 400 and the heat dissipation cover 500 are mainly fixed with each other via the screws 710, and several columns 720 are disposed in the gaps between these elements so as to provide support force, which is a common technical mean, so will not be described herein.

In order to enhance heat dissipation effect, the first heat sink 410 of the heat dissipation bottom plate 400 and the second heat sink 510 of the heat dissipation cover 500 are arranged in the same direction. Therefore, when the heat dissipation cover 500 is fixed on the heat dissipation bottom plate 400, the first heat sink 410 is completely connected to the second heat sink 510.

Moreover, the height of the second heat sink 510 of the heat dissipation cover 500 is less than the height of the first heat sink 410 of the heat dissipation bottom plate 400. Thus, when the heat dissipation cover 500 is fixed on the heat dissipation bottom plate 400, the top surface of the first heat sink 410 can be aligned with the top surface of the second heat sink 510.

Via the above design, it looks like that the heat dissipation bottom plate 400 and the heat dissipation cover 500 have one common heat sink, which can improve the heat conduction thereof and effectively dissipate heat.

So as to further enhance heat dissipation, the fan 420 directly faces the chip 120 or other heating elements, such as circuit, on the card body 100.

Further, the first heat sink 410 of the heat dissipation bottom plate 400 includes a recess 430 and the fan 420 is disposed inside the recess 430. Therefore, the heat transferred from the heat sink 410 can directly enter the working area of the fan 420, which can enhance heat dissipation.

Figure 6:
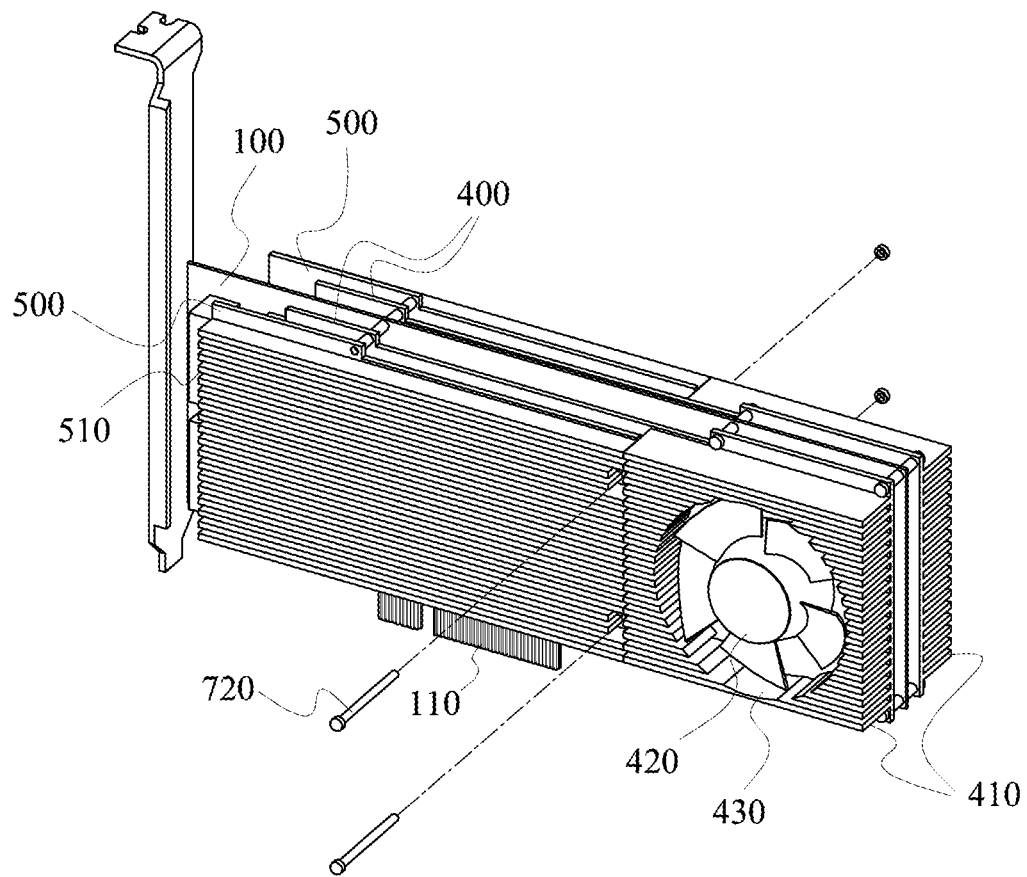
FIG. 6 is the schematic view of the SSD adapter card installed with plural SSDs on the both sides thereof of the third embodiment in accordance with the present invention.

With reference to FIG. 6 for the solid-state drive adapter card of the third embodiment in accordance with the present invention, the SSD adapter card can be further expanded. As shown in FIG. 6, the both sides of the card body 100 can are installed with the low connection base 200, the high connection base 300, the heat dissipation bottom plate 400, the heat dissipation cover 500, the first M.2 solid-state drive 610 and the second M.2 solid-state drive 620 respectively.

Preferably, the SSD adapter card may further include at least one screw rod 700, which penetrates through the both sides of the card body 100 to fix the heat dissipation bottom plates 400 and the heat dissipation covers 500 so as to conveniently and stably install the above elements on the both sides of the card body 100.

The above disclosure is related to the detailed technical contents and inventive features thereof. Those skilled in the art may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A solid-state drive adapter card, comprising: a card body, comprising a terminal disposed on a bottom thereof and connected to an interface card slot; at least one low connection base, disposed on the card body and comprising a first slot for a first M.2 solid-state drive to be inserted therein; at least one high connection base, disposed on the card body, wherein the first slot faces away from the high connection base and the high connection base comprises a second slot, taller than the low connection base, for a second M.2 solid-state drive to be inserted therein; a heat dissipation bottom plate, disposed between the first M.2 solid-state drive and the second M.2 solid-state drive, and fixed on the card body, wherein one end, protruding from the second M.2 solid-state drive, of the heat dissipation bottom plate is provided with a first heat sink, and a fan is disposed thereon; and a heat dissipation cover, disposed on an outer side of the second M.2 solid-state drive and fixed on the heat dissipation bottom plate, wherein the heat dissipation cover is provided with a second heat sink.

2. The solid-state drive adapter card of claim 1, wherein the first heat sink of the heat dissipation bottom plate and the second heat sink of the heat dissipation cover are arranged in the same direction, whereby when the heat dissipation cover is fixed on the heat dissipation bottom plate, the first heat sink is completely connected to the second heat sink so as to improve heat dissipation.

3. The solid-state drive adapter card of claim 1, wherein a height of the second heat sink of the heat dissipation cover is less than a height of the first heat sink of the heat dissipation bottom plate, wherein when the heat dissipation cover is fixed on the heat dissipation bottom plate, a top surface of the first heat sink is aligned with a top surface of the second heat sink.

4. The solid-state drive adapter card of claim 1, wherein the fan directly faces heating elements, comprising a chip or a circuit, on the card body.

5. The solid-state drive adapter card of claim 1, wherein the first heat sink of the heat dissipation bottom plate comprises a recess and the fan is disposed inside the recess.

6. The solid-state drive adapter card of claim 1, wherein both sides of the card body are provided with the low connection base, the high connection base, the heat dissipation bottom plate, the heat dissipation cover, the first M.2 solid-state drive and the second M.2 solid-state drive respectively.

7. The solid-state drive adapter card of claim 6, further comprising at least one screw rod penetrates through the both sides of the card body in order to fix the heat dissipation bottom plates and the heat dissipation covers.

* * * * *